US007001850B2

(12) United States Patent
Nemani et al.

(10) Patent No.: US 7,001,850 B2
(45) Date of Patent: *Feb. 21, 2006

(54) METHOD OF DEPOSITING DIELECTRIC FILMS

(75) Inventors: Srinivas D Nemani, San Jose, CA (US); Li-Qun Xia, Santa Clara, CA (US); Dian Sugiarto, Sunnyvale, CA (US); Ellie Yieh, San Jose, CA (US); Ping Xu, Fremont, CA (US); Francimar Campana-Schmitt, Milpitas, CA (US); Jia Lee, Campbell, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/894,872

(22) Filed: Jul. 20, 2004

(65) Prior Publication Data

US 2005/0020048 A1 Jan. 27, 2005

Related U.S. Application Data

(63) Continuation of application No. 09/627,667, filed on Jul. 28, 2000, now Pat. No. 6,764,958.

(51) Int. Cl.
*H01L 21/31* (2006.01)
*H01L 21/469* (2006.01)

(52) U.S. Cl. ...................................................... 438/758

(58) Field of Classification Search ................ 438/758, 438/763, 931, 689, 695, 638, 738, 633, 634, 438/626, 355, 700, 702, 717, 740, 784
See application file for complete search history.

(56) References Cited

U.S. PATENT DOCUMENTS

| | | | |
|---|---|---|---|
| 3,960,619 | A | 6/1976 | Seiter |
| 4,262,631 | A | 4/1981 | Kubacki |
| 4,532,150 | A | 7/1985 | Endo et al. |
| 4,634,601 | A | 1/1987 | Hamakawa et al. |
| 4,759,947 | A | 7/1988 | Ishihara et al. |
| 4,822,697 | A | 4/1989 | Haluska et al. |
| 4,885,220 | A | 12/1989 | Kuhman et al. |
| 4,894,352 | A | 1/1990 | Lane et al. |
| 5,082,695 | A | 1/1992 | Yamada et al. |
| 5,103,285 | A | 4/1992 | Furumura et al. |
| 5,238,866 | A | 8/1993 | Bolz et al. |
| 5,300,951 | A | 4/1994 | Yamazaki |

(Continued)

FOREIGN PATENT DOCUMENTS

EP 0 771 886 6/1997

(Continued)

OTHER PUBLICATIONS

Lang, et al., "A Method of Depositing a Low K Dielectric Barrier Film for Copper Damascene Application," filed Mar. 4, 2002, U.S. Appl. No. 10/092,203.

(Continued)

*Primary Examiner*—David A. Zarneke
(74) *Attorney, Agent, or Firm*—Patterson & Sheridan

(57) ABSTRACT

A method of forming a silicon carbide layer for use in integrated circuit fabrication processes is provided. The silicon carbide layer is formed by reacting a gas mixture comprising a silicon source, a carbon source, and a dopant in the presence of an electric field. The as-deposited silicon carbide layer has a compressibility that varies as a function of the amount of dopant present in the gas mixture during later formation.

32 Claims, 5 Drawing Sheets

U.S. PATENT DOCUMENTS

| | | | | |
|---|---|---|---|---|
| 5,465,680 | A | | 11/1995 | Loboda |
| 5,508,067 | A | | 4/1996 | Sato et al. |
| 5,591,494 | A | | 1/1997 | Sato et al. |
| 5,591,566 | A | | 1/1997 | Ogawa |
| 5,597,566 | A | | 1/1997 | Huls |
| 5,711,987 | A | | 1/1998 | Bearinger et al. |
| 5,818,071 | A | | 10/1998 | Loboda et al. |
| 5,926,740 | A | | 7/1999 | Forbes et al. |
| 5,953,627 | A | | 9/1999 | Carter et al. |
| 5,989,998 | A | | 11/1999 | Sugahara et al. |
| 5,998,100 | A | | 12/1999 | Azuma et al. |
| 6,041,734 | A | | 3/2000 | Raoux et al. |
| 6,046,758 | A | | 4/2000 | Brown et al. |
| 6,051,321 | A | | 4/2000 | Lee et al. |
| 6,054,379 | A | | 4/2000 | Yau et al. |
| 6,060,132 | A | | 5/2000 | Lee |
| 6,068,884 | A | | 5/2000 | Rose et al. |
| 6,140,226 | A | | 10/2000 | Grill et al. |
| 6,147,009 | A | | 11/2000 | Grill et al. |
| 6,159,871 | A | | 12/2000 | Loboda et al. |
| 6,287,990 | B1 | | 9/2001 | Cheung et al. |
| 6,312,793 | B1 | | 11/2001 | Grill et al. |
| 6,316,167 | B1 | | 11/2001 | Angelopoulos et al. |
| 6,340,628 | B1 | | 1/2002 | Van Cleemput et al. |
| 6,364,954 | B1 | | 4/2002 | Umotoy et al. |
| 6,410,437 | B1 | | 6/2002 | Flanner et al. |
| 6,417,092 | B1 | | 7/2002 | Jain |
| 6,436,824 | B1 | | 8/2002 | Chooi et al. |
| 6,444,568 | B1 | | 9/2002 | Sundararajan et al. |
| 6,462,371 | B1 | | 10/2002 | Weimer et al. |
| 6,465,366 | B1 | | 10/2002 | Nemani et al. |
| 6,528,423 | B1 | | 3/2003 | Cataby et al. |
| 6,534,397 | B1 | | 3/2003 | Okada et al. |
| 6,537,733 | B1 | | 3/2003 | Campana et al. |
| 6,555,476 | B1 | | 4/2003 | Olsen et al. |
| 6,593,653 | B1 | | 7/2003 | Sundararajan et al. |
| 6,627,532 | B1 | | 9/2003 | Gaillard et al. |
| 6,630,412 | B1 | | 10/2003 | Shioya et al. |
| 6,645,883 | B1 | | 11/2003 | Yamamoto et al. |
| 6,764,958 | B1 | * | 7/2004 | Nemani et al. ............. 438/758 |
| 6,794,311 | B1 | | 9/2004 | Huang et al. |
| 2002/0164872 | A1 | | 11/2002 | Han et al. |
| 2002/0182894 | A1 | | 12/2002 | Andideh |
| 2003/0020108 | A1 | | 1/2003 | Weimer et al. |
| 2003/0045125 | A1 | | 3/2003 | Bao et al. |

FOREIGN PATENT DOCUMENTS

| | | |
|---|---|---|
| EP | 0 926 715 | 6/1999 |
| EP | 0 926 724 | 6/1999 |
| JP | 61257475 | 11/1986 |
| JP | 10223758 | 8/1998 |
| WO | WO 00/19498 | 4/2000 |
| WO | WO 00/19508 | 4/2000 |

OTHER PUBLICATIONS

European Search Report from EP 01 11 6054, dated Oct. 30, 2001.

* cited by examiner

METHOD OF DEPOSITING DIELECTRIC FILMS

CROSS-REFERENCE TO RELATED APPLICATIONS

This application is a continuation of U.S. patent application Ser. No. 09/627,667, filed Jul. 28, 2000, now U.S. Pat. No. 6,764,958 which is herein incorporated by reference. This application is related to commonly assigned, copending U.S. patent application Ser. No. 09/165,248, entitled "A Silicon Carbide Deposition for Use as a Barrier Layer and an Etch Stop," filed on Oct. 1, 1998, which is incorporated herein by reference. This application is also related to commonly assigned, U.S. patent application Ser. No. 09/219,945 entitled "A Silicon Carbide Deposition for Use as a Low Dielectric Constant Anti-Reflective Coating," filed on Dec. 23, 1998, now issued as U.S. Pat. No. 6,635,583, on Oct. 21, 2003, which is incorporated herein by reference.

BACKGROUND OF THE INVENTION

1. Field of the Invention

The present invention relates to silicon carbide layers and, more particularly to a method of forming silicon carbide layers.

2. Description of the Related Art

Integrated circuits have evolved into complex devices that can include millions of components (e. g., transistors, capacitors and resistors) on a single chip. The evolution of chip designs continually requires faster circuitry and greater circuit densities. The demands for greater circuit densities necessitate a reduction in the dimensions of the integrated circuit components.

As the dimensions of the integrated circuit components are reduced (e. g., sub-micron dimensions), the materials used to fabricate such components contribute to the electrical performance of such components. For example, low resistivity metal interconnects (e. g., aluminum and copper) provide conductive paths between the components on integrated circuits.

Typically, the metal interconnects are electrically isolated from each other by a bulk insulating material. When the distance between adjacent metal interconnects and/or the thickness of the bulk insulating material has sub-micron dimensions, capacitive coupling potentially occurs between such interconnects. Capacitive coupling between adjacent metal interconnects may cause cross talk and/or resistance-capacitance (RC) delay which degrades the overall performance of the integrated circuit.

In order to minimize capacitive coupling between adjacent metal interconnects, low dielectric constant bulk insulating materials (e. g., dielectric constants less than about 3.0) are needed. Typically, bulk insulating materials with dielectric constants less than about 3.0 are tensile materials (e. g., tensile stresses of greater than about $10^8$ dynes/cm$^2$). Examples of low dielectric constant bulk insulating materials include silicon dioxide ($SiO_2$), silicate glass, and fluorosilicate glass (FSG), among others.

In addition, a low dielectric constant (low k) barrier layer often separates the metal interconnects from the bulk insulating materials. The barrier layer minimizes the diffusion of the metal into the bulk insulating material. Diffusion of the metal into the bulk insulating material is undesirable because such diffusion can affect the electrical performance of the integrated circuit, or render it inoperative.

Some integrated circuit components include multilevel interconnect structures (e. g., dual damascene structures). Multilevel interconnect structures can have two or more bulk insulating layers, low dielectric barrier layers, and metal layers stacked one on top of another. When bulk insulating materials that are tensile are incorporated into a multilevel interconnect structure, such interconnect structure can undesirably crack and/or peel away from an underlying substrate.

The demands for greater integrated circuit densities also impose demands on the process sequences used for integrated circuit manufacture. For example, in process sequences using conventional lithographic techniques, a layer of energy sensitive resist is formed over a stack of material layers on a substrate. Many of these underlying material layers are reflective to ultraviolet light. Such reflections can distort the dimensions of features such as lines and vias that are formed in the energy sensitive resist material.

One technique proposed to minimize reflections from an underlying material layer uses an anti-reflective coating (ARC). The ARC is formed over the reflective material layer prior to resist patterning. The ARC suppresses the reflections off the underlying material layer during resist imaging, providing accurate pattern replication in the layer of energy sensitive resist.

Silicon carbide (SiC) has been suggested for use as a barrier layer and/or ARC on integrated circuits, since silicon carbide layers can have a low dielectric constant (dielectric constant less than about 5.5), are good metal diffusion barriers and can have good light absorption properties.

Therefore, there is an ongoing need for a method of forming silicon carbide films with low dielectric constant and improved film characteristics that are also suitable for use as ARCs.

SUMMARY OF THE INVENTION

A method of forming a silicon carbide layer for use in integrated circuit fabrication processes is provided. The silicon carbide layer is formed by reacting a gas mixture comprising a silicon source, a carbon source, and a dopant in the presence of an electric field. The as-deposited silicon carbide layer has a compressibility that varies as a function of the amount of dopant present in the gas mixture during layer formation.

The silicon carbide layer is compatible with integrated circuit fabrication processes. In one integrated circuit fabrication process, the silicon carbide layer is used as both a hardmask and a barrier layer for fabricating integrated circuit structures such as, for example, a dual damascene structure. For such an embodiment, a preferred process sequence includes depositing a silicon carbide barrier layer on a metal layer formed on a substrate. After the silicon carbide barrier layer is deposited on the substrate a first dielectric layer is formed thereon. A silicon carbide hardmask layer is formed on the first dielectric layer. The silicon carbon hardmask layer is patterned to define vias therein. Thereafter, a second dielectric layer is formed on the patterned silicon carbide hardmask layer. The second dielectric layer is patterned to define interconnects therein. The interconnects formed in the second dielectric layer are positioned over the vias defined in the silicon carbide hardmask layer. After the second dielectric layer is patterned, the vias defined in the silicon carbide hardmask layer are transferred into the first dielectric layer. Thereafter, the dual damascene structure is completed by filling the vias and interconnects with a conductive material.

In another integrated circuit fabrication process, the silicon carbide layer is used as an anti-reflective coating (ARC) for DUV lithography. For such an embodiment, a preferred process sequence includes forming the silicon carbide layer on a substrate. The silicon carbide layer has a refractive index (n) in a range of about 1.6 to about 2.2 and an absorption coefficient (κ) in a range of about 0.1 to about 0.6 at wavelengths less than about 250 nm. The refractive index (n) and the absorption coefficient (κ) for the silicon carbide layer are tunable, in that they can be varied in the desired range as a function of the composition of the gas mixture during SiC layer formation. After the silicon carbide layer is formed on the substrate, a layer of energy sensitive resist material is formed thereon. A pattern is defined in the energy sensitive resist at a wavelength less than about 250 nm. Thereafter, the pattern defined in the energy sensitive resist material is transferred into the silicon carbide layer. After the silicon carbide layer is patterned, such pattern is optionally transferred into the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
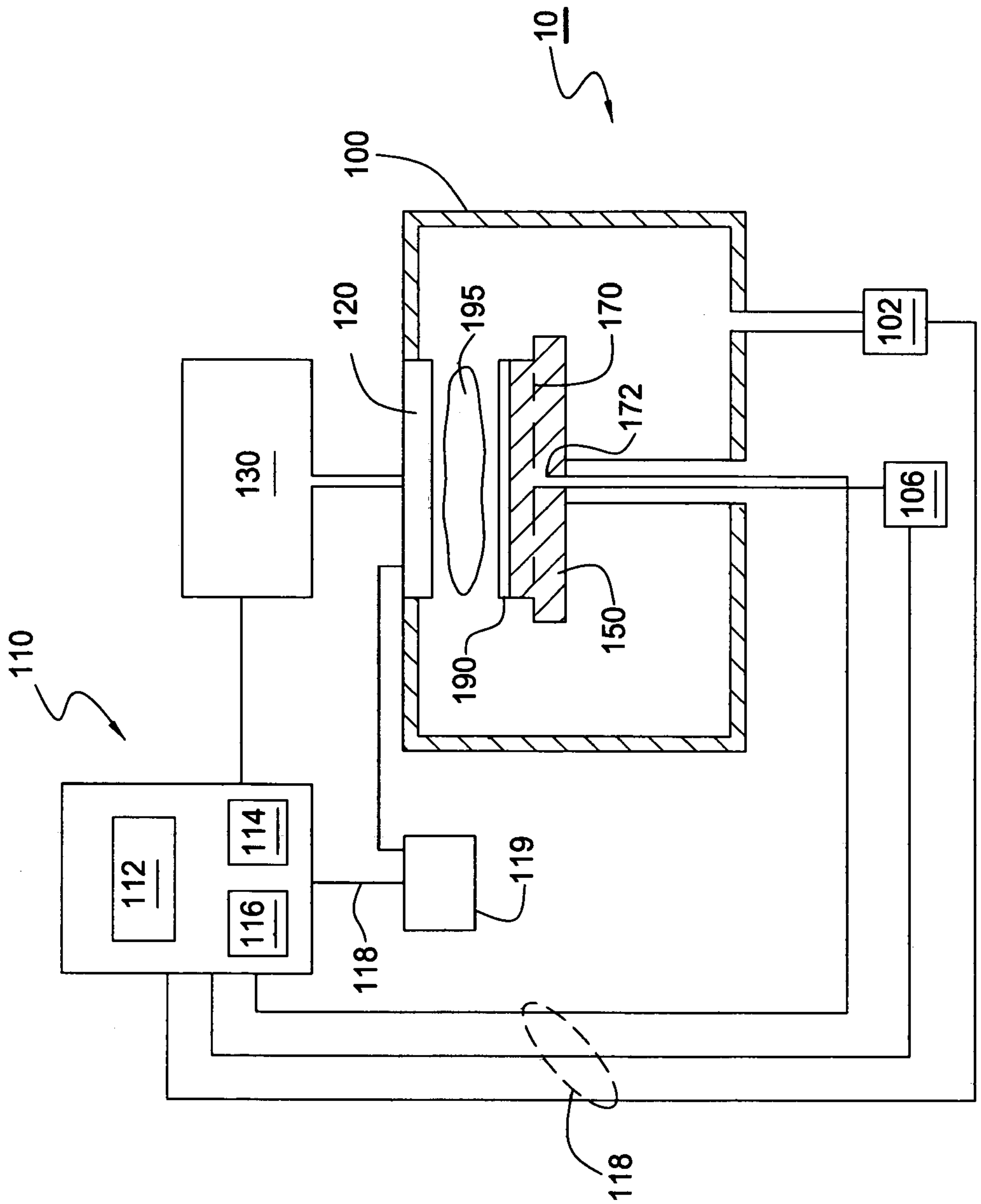
FIG. 1 depicts a schematic illustration of an apparatus that can be used for the practice of embodiments described herein.

FIG. 1 is a schematic representation of a wafer processing system 10 that can be used to perform silicon carbide layer deposition in accordance with embodiments described herein. System 10 typically comprises a process chamber 100, a gas panel 130, a control unit 110, along with other hardware components such as power supplies 119, 106 and vacuum pumps 102. Examples of wafer processing system 10 include plasma enhanced chemical vapor deposition (PECVD) chambers such as DXZ™ chambers, commercially available from Applied Materials Inc., located in Santa Clara, Calif.

Details of wafer processing system 10 are described in commonly assigned U.S. patent application Ser. No. 09/211,998, entitled "High Temperature Chemical Vapor Deposition Chamber", filed on Dec. 14, 1998, and is herein incorporated by reference. The salient features of this system 10 are briefly described below.

The process chamber 100 generally houses a support pedestal 150, which is used to support a substrate such as a semiconductor wafer 190. This pedestal 150 can typically be moved in a vertical direction inside the chamber 100 using a displacement mechanism (not shown).

Depending on the specific process, the wafer 190 can be heated to some desired temperature prior to SiC layer deposition. For example, the wafer support pedestal 150 is heated by an embedded heater element 170. The pedestal 150 may be resistively heated by applying an electric current from an AC power supply 106 to the heater element 170. The wafer 190 is, in turn, heated by the pedestal 150.

A temperature sensor 172, such as a thermocouple, is also embedded in the wafer support pedestal 150 to monitor the temperature of the pedestal 150 in a conventional manner. The measured temperature is used in a feedback loop to control the power supplied to the heating element 170, such that the wafer temperature can be maintained or controlled at a desired temperature which is suitable for the particular process application. The pedestal is optionally heated using radiant heat (not shown).

A vacuum pump 102, is used to evacuate the process chamber 100 and to maintain the proper gas flows and pressure inside the chamber 100. A showerhead 120, through which process gases are introduced into the chamber 100, is located above the wafer support pedestal 150. The showerhead 120 is connected to a gas panel 130, which controls and supplies various gases used in different steps of the process sequence.

The showerhead 120 and wafer support pedestal 150 also form a pair of spaced apart electrodes. When an electric field is generated between these electrodes, the process gases introduced into the chamber 100 are ignited into a plasma. The electric field is generated by connecting the showerhead 120 to a source of radio frequency (RF) power (not shown) through a matching network (not shown). Alternatively, the RF power source and the matching network may be coupled to the wafer support pedestal 150, or coupled to both the showerhead 120 and the wafer support pedestal 150.

Alternatively, the electric field may be generated by connecting the showerhead 120 to a source of mixed radio frequency (RF) power 119. Details of the mixed RF power source 119 are described in commonly assigned U.S. Pat. No. 6,041,734, entitled, "Use of an Asymmetric Waveform to Control Ion Bombardment During Substrate Processing", issued on Mar. 28, 2000, and is herein incorporated by reference.

Typically, the source of mixed RF power 119 under the control of a controller unit 110 provides a high frequency power (e. g., RF power in a range of about 10 MHz to about 15 MHz) as well as a low frequency power (e. g., RF power in a range of about 150 KHz to about 450 KHz) to the showerhead 120. Both the high frequency RF power and the low frequency RF power are coupled to the showerhead 120 through a matching network (not shown). The high frequency RF power source and the low frequency RF power source may optionally be coupled to the wafer support pedestal 150, or one coupled to the showerhead 120 and the other to the wafer support pedestal 150.

Plasma enhanced chemical vapor deposition (PECVD) techniques promote excitation and/or disassociation of the reactant gases by the application of the electric field to the reaction zone near the substrate surface, creating a plasma of reactive species. The reactivity of the species in the plasma reduces the energy required for a chemical reaction to take place, in effect lowering the required temperature for such PECVD processes.

Proper control and regulation of the gas flows through the gas panel 130 is performed by mass flow controllers (not shown) and the controller unit 110. The showerhead 120 allows process gases from the gas panel 130 to be uniformly introduced and distributed in the process chamber 100.

Illustratively, the control unit 110 comprises a central processing unit (CPU) 113, support circuitry 114, and memories containing associated control software 116. The control unit 110 is responsible for automated control of the numerous steps required for wafer processing—such as wafer transport, gas flow control, mixed RF power control, temperature control, chamber evacuation, and other steps. Bi-directional communications between the control unit 110 and the various components of the wafer processing system 10 are handled through numerous signal cables collectively referred to as signal buses 118, some of which are illustrated in FIG. 1.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support pedestal 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

Silicon Carbide Layer Formation

In one embodiment, the silicon carbide layer is formed by reacting a gas mixture including a silicon source, a carbon source, and a dopant. The silicon source and the carbon source may be an organosilane compound having the general formula $Si_xC_yH_z$, where x has a range from 1 to 2, y has a range from 1 to 6, and z has a range from 4 to 18. For example, methylsilane ($SiCH_6$), dimethylsilane ($SiC_2H_8$), trimethylsilane ($SiC_3H_{10}$), tetramethylsilane ($SiC_4H_{12}$), and diethylsilane ($SiC_4H_{12}$), among others may be used as the organosilane compound. Alternatively, silane ($SiH_4$), disilane ($Si_2H_6$), methane ($CH_4$), and combinations thereof, may be used as the silicon source and the carbon source.

Ammonia ($NH_3$), methane ($CH_4$), silane ($SiH_4$) ethyene ($C_2H_4$), acetylene ($C_2H_2$), nitrogen ($N_2$), or combinations thereof among others may be used for the dopant.

The gas mixture may further comprise an inert gas. Helium (He), argon (Ar), nitrogen ($N_2$), or combinations thereof, among others, may be used for the inert gas.

In general, the following deposition process parameters can be used to form the silicon carbide layer. The process parameters range from a wafer temperature of about 150° C. to about 450° C., a chamber pressure of about 1 torr to about 15 torr, a silicon source and/or carbon source flow rate of about 10 sccm to about 2000 sccm, a dopant flow rate of about 50 sccm to about 10,000 sccm, an inert gas flow rate less than about 1000 sccm, a plate spacing of about 300 mils to about 600 mils, and one or more RF powers of about 100 watts to about 1000 watts. Additionally, the ratio of the silicon source to the dopant in the gas mixture should have a range of about 1:1 to about 1:100. The above process parameters provide a deposition rate for the silicon carbide layer in a range of about 100 Å/min to about 3000 Å/min when implemented on a 200 mm (millimeter) substrate in a deposition chamber available from Applied Materials, Inc., located in Santa Clara, Calif.

Other deposition chambers are within the scope of the invention, and the parameters listed above may vary according to the particular deposition chamber used to form the silicon carbide layer. For example, other deposition chambers may have a larger or smaller volume, requiring gas flow rates that are larger or smaller than those recited for deposition chambers available from Applied Materials, Inc. and may be configured to accommodate 300 mm substrates.

An as-deposited silicon carbide layer has a compressability that varies as a function of the amount of dopant in the gas mixture during layer formation. In particular as the dopant concentration in the gas mixture is increased the compressability of the deposited silicon carbide layer also increases. It is believed that the compressibility of the silicon carbide layer increases because the dopant reduces the number of unstable species (e. g., Si—$CH_2$) in the silicon carbide layer. The compressibility of the silicon carbide layer as used in this disclosure is a measure of its resistance to cracking and peeling. The compressibility of the deposited silicon carbide layer is greater than about $5\times10^8$ dynes/$cm^2$.

Additionally, it is believed that some nitrogen from the nitrogen based dopants (e. g., $NH_3$, $N_2$) may be incorporated into the deposited silicon carbide layer during layer formation. Such incorporation may stabilize the layer in that it becomes less reactive with moisture and/or oxygen under atmospheric conditions.

The as-deposited silicon carbide layer has a dielectric constant that is less than about 5.5, making it suitable for use as a barrier material in integrated circuits. The dielectric constant of the silicon carbide layer is tunable, in that it can be varied as a function of the RF power. In particular, as the RF power increases the dielectric constant of the as-deposited silicon carbide layer also increases. Additionally, the dielectric constant can be varied as a function of the dopant concentration in the gas mixture. In particular, as the dopant concentration increases, the dielectric constant of the deposited silicon carbide layer decreases.

In addition, the leakage current of the as-deposited silicon carbide layer can be varied as a function of dopant concentration in the gas mixture. In particular, as the dopant concentration increases, the leakage current of the deposited silicon carbide layer decrases. The leakage current of the silicon carbide layer at 2 MV/cm was typically less than about $1\times10^{-8}$ A/$cm^2$. For example, the an as-deposited silicon carbide layer doped with ammonia had a leakage current at about 2 MV/cm (megavolts/centimeter) that is less than about $1\times10^{-9}$ A/$cm^2$, which is suitable for minimizing cross-talk between integrated circuit interconnect structures. Dependant on the percursors used to form the silicon carbide layer, outgassing of carbon and or hydrogen containing species may occur. Increasing the concentration of dopant in the gas mixture is believed to reduce such outgassing from the deposited silicon carbide layer.

The silicon carbide layer also has a light absorption coefficient (κ) that can be varied between about 0.1 to about 0.6 at wavelengths below about 250 nm (nanometers), making it suitable for use as an anti-reflective coating (ARC) at DUV wavelengths. The absorption coefficient of the silicon carbide layer can be varied as a function of the composition of the gas mixture. In particular, as the dopant concentration is increased the absorption coefficient of the as-deposited layer likewise increases.

After the silicon carbide layer is formed, it may be plasma treated with an inert gas. Helium (He), argon (Ar), nitrogen ($N_2$), and combinations thereof, may be used for the inert gas. Such plasma treatment is believed to stabilize the layer in that it becomes less reactive with moisture and/or oxygen under atmospheric conditions.

In general, the following process parameters can be used to plasma treat the silicon carbide layer in a process chamber similar to that shown in FIG. 1. The process parameters range from a chamber pressure of about 5 torr to about 10 torr, and inert gas flow rate of about 1000 sccm to about 7000 sccm, and a radio frequency (RF) power of about 100 watts to about 1000 watts. The silicon carbide layer is plasma treated for less than about 120 seconds.

A silicon carbide cap layer may optionally be formed on the silicon carbide layer. The silicon carbide cap layer is formed without the addition of the dopant gas, according to the silicon carbide process parameters described above. The thickness of the silicon carbide cap layer is variable depending on the specific stage of processing. Typically, the silicon carbide cap layer is deposited to a thickness of less than about 200 Å.

Since it is believed that nitrogen may be incorporated in the silicon carbide layer when $NH_3$ and $N_2$ dopants are reacted with the silicon and carbon sources, the undoped silicon carbide cap layer is believed to minimize undesirable interactions between the silicon carbide layer and photoresist materials applied directly thereto. For example, some energy sensitive resist materials (e. g., Shipley UV5 deep UV resist, JSR M20G deep UV resist) react with moisture to form amino basic groups ($NH_2^-$), believed to cause "footing" (i. e., a widening of the developed resist feature at its base) of resist material on materials having nitrogen incorporated therein.

Integrated Circuit Fabrication Processes

A. Silicon Carbide Hardmask

Figures 2A, 2B, 2C, 2D, 2E:
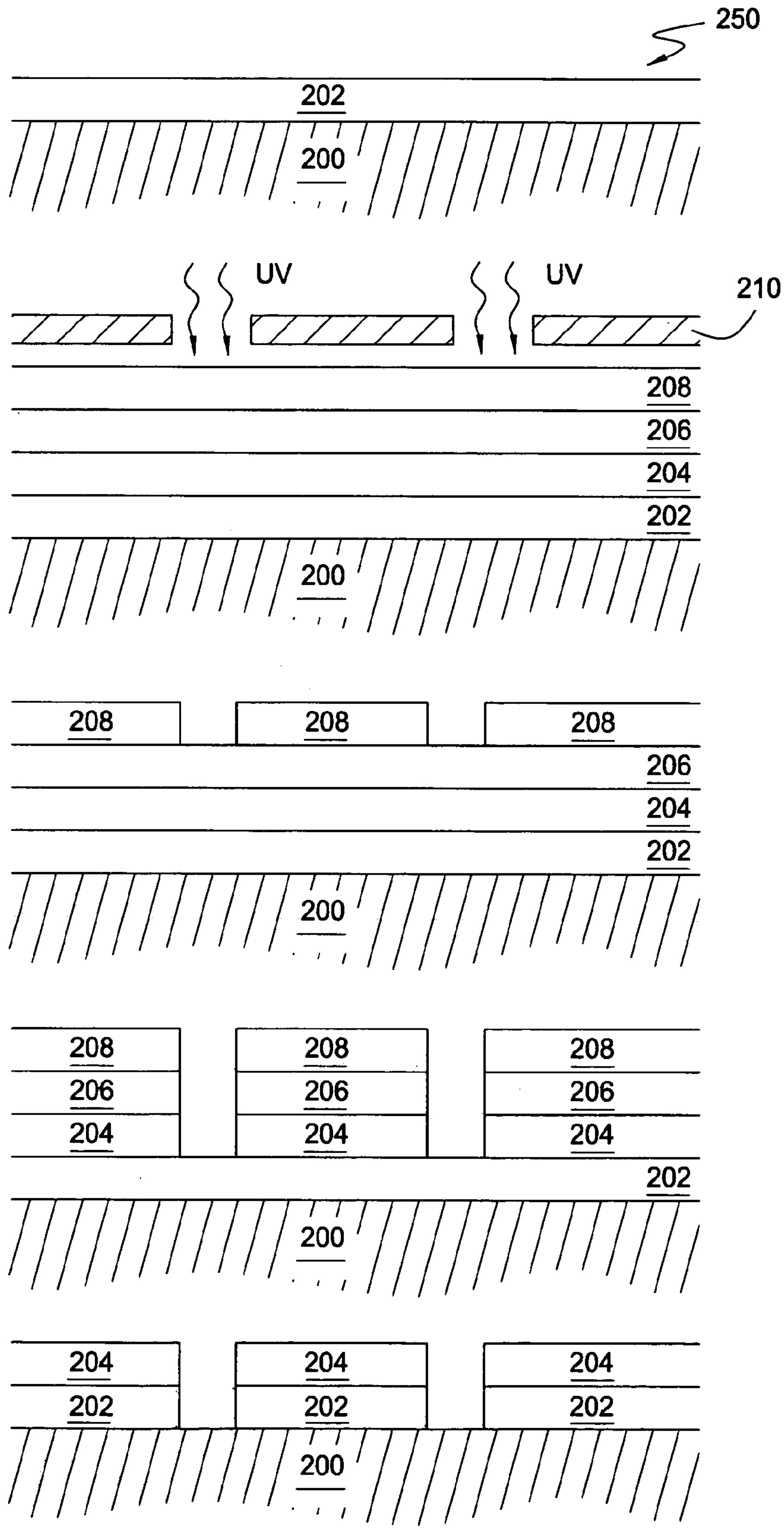
FIGS. 2*a*–2*e* depict schematic cross-sectional views of a substrate structure at different stages of integrated circuit fabrication incorporating a silicon carbide layer as a hardmask.

FIGS. 2*a*–2*e* illustrate schematic cross-sectional views of a substrate 200 at different stages of an integrated circuit fabrication sequence incorporating a silicon carbide layer as a hardmask. In general, the substrate 200 refers to any workpiece on which processing is performed, and a substrate structure 250 is used to generally denote the substrate together with other material layers formed on the substrate 200. Depending on the specific stage of processing, the substrate 200 may correspond to a silicon wafer, or other material layer that has been formed on the silicon wafer. FIG. 2*a*, for example, illustrates a cross-sectional view of a substrate structure 250, having a material layer 202 that has been conventionally formed thereon. The material layer 202 may be an oxide (e. g., silicon dioxide, fluorosilicate glass (FSG)). In general, the substrate 200 may include a layer of silicon, silicides, metals, or other materials. FIG. 2*a* illustrates one embodiment in which the substrate 200 is silicon having a silicon dioxide layer formed thereon.

FIG. 2*b* depicts a silicon carbide layer 204 formed on the substrate structure 250 of FIG. 2*a*. The silicon carbide layer 204 is formed on the substrate structure 250 according to the process parameters described above. The thickness of the silicon carbide layer is variable depending on the specific stage of processing. Typically, the silicon carbide layer is deposited to a thickness of about 50 Å to about 1000 Å.

A layer of energy sensitive resist material 208 is formed on the silicon carbide layer 204. The layer of energy sensitive resist material 208 can be spin coated on the substrate to a thickness within a range of about 4,000 Å to about 10,000 Å. Most energy sensitive resist materials are sensitive to ultraviolet (UV) radiation having a wavelength less than about 450 nm (nanometers). Deep ultraviolet (DUV) resist materials are sensitive to UV radiation having wavelengths less than about 245 nm.

Dependent on the etch chemistry of the energy sensitive resist material used in the fabrication sequence, an intermediate layer 206 is formed on the silicon carbide layer 204. When the energy sensitive resist material 208 and the silicon carbide layer 204 can be etched using the same chemical etchants or when resist poisoning may occur, the intermediate layer 206 functions as a mask for the silicon carbide layer 204. The intermediate layer 206 is conventionally formed on the silicon carbide layer 204. The intermediate layer 206 may be a silicon carbide cap layer, an oxide, nitride, silicon oxynitride, amorphous silicon, or other suitable material.

An image of a pattern is introduced into the layer of energy sensitive resist material 208 by exposing such energy sensitive resist material 208 to UV radiation via mask 210. The image of the pattern introduced in the layer of energy sensitive resist material 208 is developed in an appropriate developer to define the pattern therethrough, as shown in FIG. 2*c*. Thereafter, referring to FIG. 2*d*, the pattern defined in the energy sensitive resist material 208 is transferred through the silicon carbide layer 204. The pattern is transferred through the silicon carbide layer 204 using the energy sensitive resist material 208 as a mask. The pattern is transferred through the silicon carbide layer 204 using an appropriate chemical etchant. For example, flourocarbon compounds such as trifluoromethane ($CF_3H$) may be used to chemically etch the silicon carbide layer 204.

Alternatively, when the intermediate layer 206 is present, the pattern defined in the energy sensitive resist material 208 is first transferred through the intermediate layer 206 using the energy sensitive resist material as a mask. Thereafter, the pattern is transferred through the silicon carbide layer 204 using the intermediate layer 206 as a mask. The pattern is transferred through both the intermediate layer 206 as well as the silicon carbide layer 204 using appropriate chemical etchants.

FIG. 2*e* illustrates the completion of the integrated circuit fabrication sequence by the transfer of the pattern defined in the silicon carbide layer 204 through the silicon dioxide layer 202 using the silicon carbide layer 204 as a hardmask.

After the silicon dioxide layer 202 is patterned, the silicon carbide layer 204 can optionally be stripped from the substrate 200 by etching it in a suitable chemical etchant.

B. Damascene Structure Incorporating a Silicon Carbide Layer

Figure 3A:
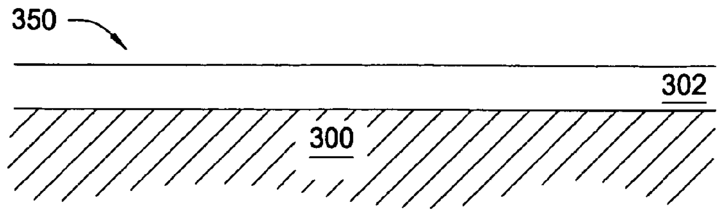
FIGS. 3*a*–3*g* depict schematic cross-sectional views of a damascene structure at different stages of integrated circuit fabrication incorporating a silicon carbide layer as a hardmask.

FIGS. 3*a*–3*g* illustrate schematic cross-sectional views of a substrate 300 at different stages of a dual damascene structure fabrication sequence incorporating a silicon carbide barrier layer and a silicon carbide hard mask therein. Dual damascene structures are typically used to form multilayer metal interconnects on integrated circuits. Depending on the specific stage of processing, substrate 300 may correspond to a silicon wafer, or other material layer that has been formed on the substrate 300. FIG. 3*a*, for example, illustrates a cross-sectional view of a substrate 300 having a metal layer 302 (e. g., copper (Cu), aluminum (Al), tungsten (W)) formed thereon.

FIG. 3*a* illustrates one embodiment in which the substrate 300 is silicon having a copper (Cu) layer formed thereon. The copper layer 302 has a thickness of about 5,000 Å to about 5 microns, depending on the size of the structure to be fabricated.

Figure 3B:
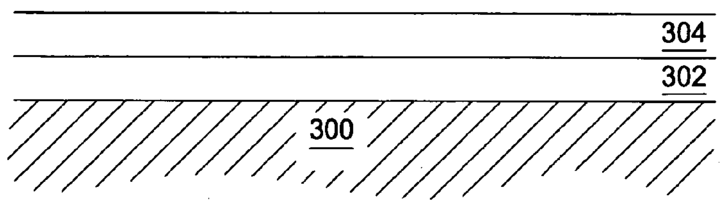

Referring to FIG. 3*b*, a silicon carbide barrier layer 304 is formed on the copper layer 302. The silicon carbide barrier layer 304 is formed on the copper layer 302 according to the process parameters described above. The silicon carbide barrier layer 304 is compressive and has a dielectric constant less than about 5.5. The dielectric constant as well as the compressibility of the silicon carbide barrier layer is can be varied as a function of the gas composition (e. g., dopant concentration) during layer formation.

The thickness of the silicon carbide barrier layer 304 is variable depending on the specific stage of processing. Typically, the silicon carbide barrier layer 304 has a thickness of about 200 Å to about 1000 Å.

Figure 3C:
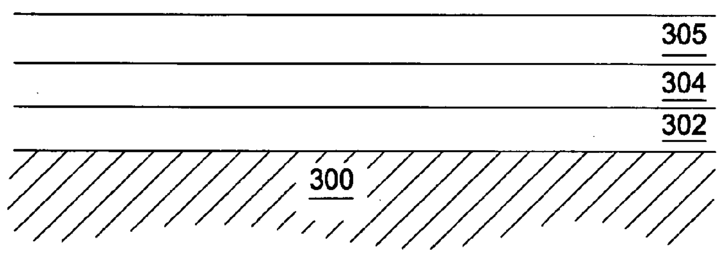

A first dielectric layer 305 is formed on the silicon carbide barrier layer 304, as illustrated in FIG. 3*c*. The first dielectric layer 305 may be an oxide (e. g., silicon dioxide, fluorosilicate glass (FSG)). The first dielectric layer 305 has a thickness of about 5,000 Å to about 10,000 Å.

Figure 3D:
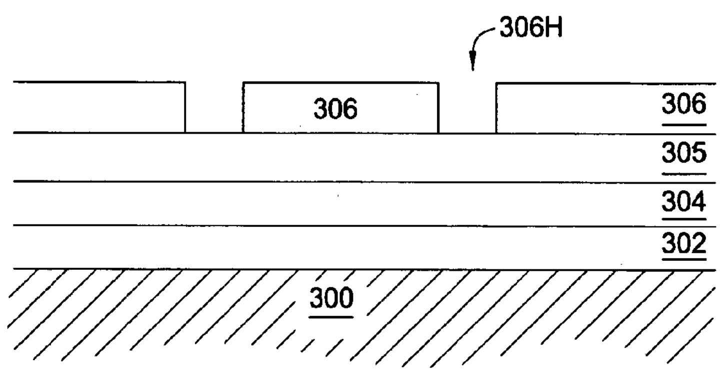

Referring to FIG. 3*d*, a silicon carbide hardmask layer 306 is formed on the first dielectric layer 305, patterned and etched to define vias therein. The silicon carbide hardmask layer 306 is formed on the first dielectric layer 305 according to the process parameters described above. The silicon carbide hardmask layer 306 is also compressive and has a dielectric constant less than about 5.5. The dielectric constant as well as the compressibility of the silicon carbide hardmask layer is can be varied as a function of the gas composition (e. g., dopant concentration) during layer formation.

The thickness of the silicon carbide hardmask layer 306 is variable depending on the specific stage of processing. Typically, the silicon carbide hardmask layer 306 has a thickness of about 200 Å to about 1000 Å.

The silicon carbide hardmask layer 306 is patterned and etched to define via openings 306 and to expose the first dielectric layer 305, in areas where the vias are to be formed. The silicon carbide hardmask layer 306 is patterned using conventional lithography as described above with reference to FIGS. 2*b*–2*d*. The silicon carbide layer is etched using a fluorocarbon compound such as trifluoromethane ($CHF_3$).

Figure 3E:
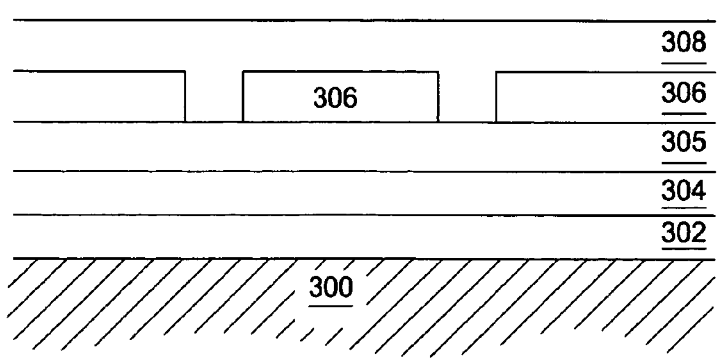

After the silicon carbide hardmask layer 306 is patterned, a second dielectric layer 308 is deposited thereover, as illustrated in FIG. 3*e*. The second dielectric layer 308 may be an oxide (e. g., silicon dioxide, fluorosilicate glass). The second dielectric layer 308 has a thickness of about 5,000 Å to about 10,000 Å.

Figure 3F:
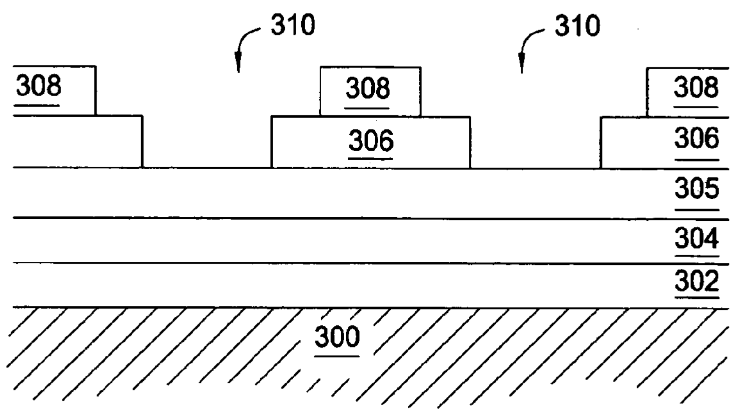

The second dielectric layer 308 is then patterned to define interconnect lines 310, as illustrated in FIG. 3*f*, preferably using conventional lithography processes described above. he interconnects 310 formed in the second dielectric layer 308 are positioned over the via openings 306 in the silicon carbide hardmask layer 306. Thereafter, both the interconnects 310 and vias 306 are etched using reactive ion etching or other anisotropic etching techniques.

Figure 3G:
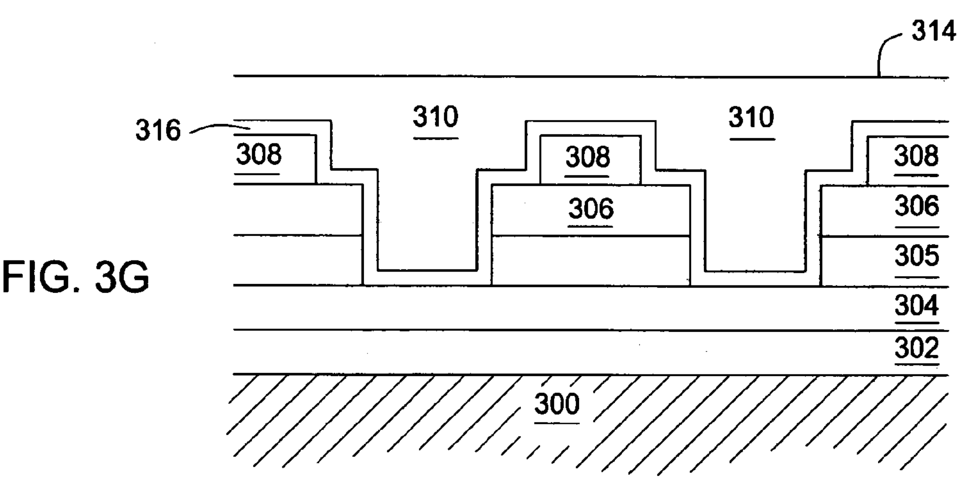

Referring to FIG. 3*g*, the interconnects 310 and the vias 306 are filled with a conductive material 314 such as aluminum, copper, tungsten, or combinations thereof. Preferably, copper is used to fill the interconnects 310 and the vias 306, due to its low resistivity (resistivity about 1.7 $\mu\Omega$-cm). The conductive material 314 is deposited using chemical vapor deposition (CVD), physical vapor deposition (PVD), electroplating, or combinations thereof, to form the damascene structure.

Additionally, a barrier layer 316 such as tantalum (Ta), tantalum nitride (TaN), or other suitable barrier material is first deposited conformably on the sidewalls of the interconnects 310 and contacts/vias 306 to prevent metal migration into the surrounding dielectric layers 305, 308 as well as the silicon carbide barrier layer 304 and the silicon carbide hardmask layer 306.

C. Silicon Carbide Anti-Reflective Coating (ARC)

Figure 4A:
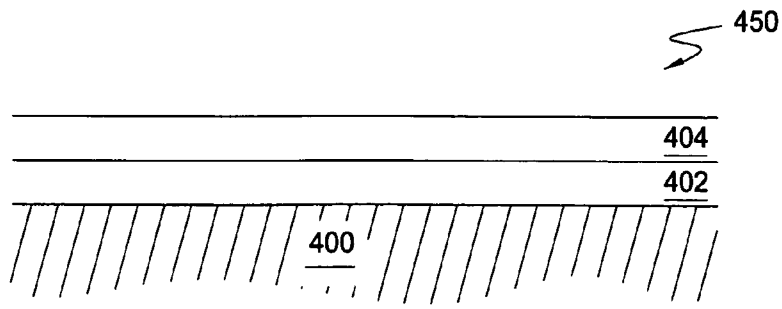
FIGS. 4*a*–4*e* depict schematic cross-sectional views of a substrate structure at different stages of integrated circuit fabrication incorporating a silicon carbide layer as an anti-reflective coating (ARC).

FIG. 4*a*–4*e* illustrate schematic cross-sectional views of a substrate 400 at different stages of an integrated circuit fabrication sequence incorporating a silicon carbide layer as an anti-reflective coating (ARC). In general, the substrate 400 refers to any workpiece on which film processing is performed, and a substrate structure 450 is used to generally denote the substrate 400 together with other material layers formed on the substrate 400. Depending on the specific stage of processing, substrate 400 may correspond to a silicon wafer, or other material layer, which has been formed on the substrate. FIG. 4*a*, for example, illustrates a cross-sectional view of a substrate structure 450 in which the substrate 400 is a silicon wafer having an oxide layer thereon.

A silicon carbide layer 402 is formed on the substrate structure 450. The silicon carbide layer 402 is formed on the substrate structure 450 according to the process parameters described above. The silicon carbide layer has an absorption coefficient (κ) that can be varied between about 0.1 to about 0.6 at wavelengths below about 250 nm (nanometers), making it suitable for use as an anti-reflective coating (ARC) at DUV wavelengths. The absorption coefficient of the silicon carbide layer is tunable, in that it can be varied in the desired range as a function of the gas composition. The thickness of the silicon carbide layer 402 is variable depending on the specific stage of processing. Typically, the silicon carbide layer has a thickness of about 200 Å to about 2000 Å.

Figure 4B:
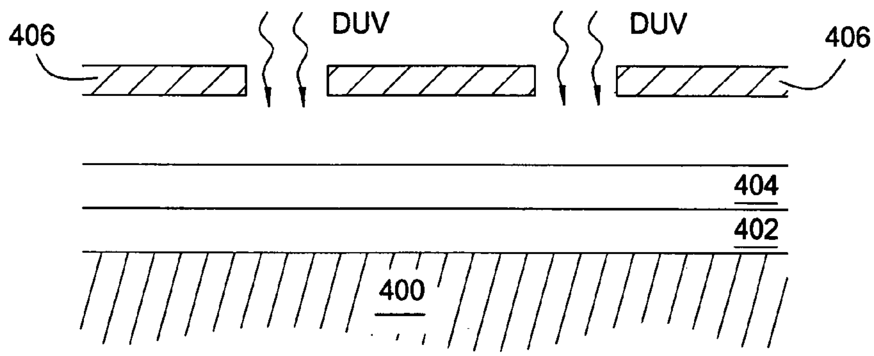

FIG. 4*b* depicts a layer of energy sensitive resist material 404 formed on the substrate structure 450 of FIG. 4*a*. The layer of energy sensitive resist material can be spin coated on the substrate structure 450 to a thickness within a range of about 2000 Å to about 6000 Å. The energy sensitive resist material is sensitive to DUV radiation having a wavelength less than 250 nm.

An image of a pattern is introduced into the layer of energy sensitive resist material 404 by exposing such energy sensitive resist material 404 to DUV radiation via mask 406. When the image of the pattern is introduced into the layer of energy sensitive resist material 404, the silicon carbide layer 402 suppresses any reflections off underlying material layers (e. g., oxides, metals) which can degrade the image of the pattern introduced in the layer of energy sensitive resist material 404.

Figure 4C:
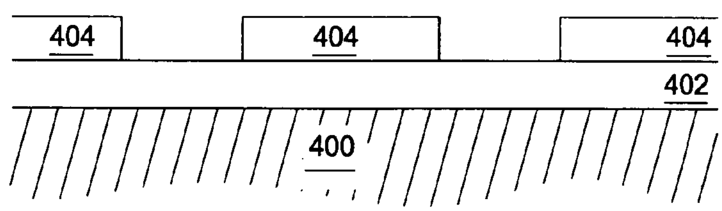
Figure 4D:
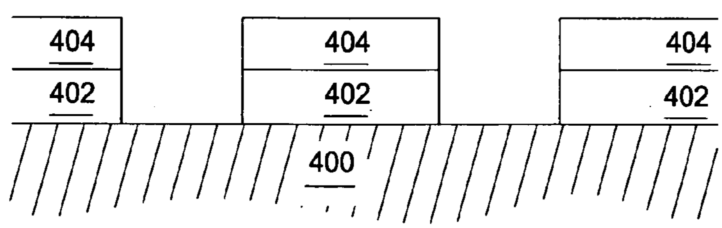

The image of the pattern introduced into the layer of energy sensitive resist material 404 is developed in an appropriate developer to define the pattern through such layer, as shown in FIG. 4*c*. Thereafter, referring to FIG. 4*d*, the pattern defined in the energy sensitive resist material 404 is transferred through the silicon carbide layer 402. The pattern is transferred through the silicon carbide layer 402 using the energy sensitive resist material 404 as a mask. The pattern is transferred through the silicon carbide layer 402 by etching it using an appropriate chemical etchant (e. g., $CHF_3$).

Figure 4E:
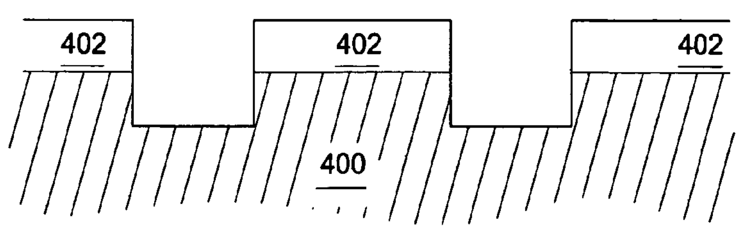

After the silicon carbide layer 402 is patterned, such pattern is typically transferred into the substrate 400, as shown in FIG. 4*e*. The pattern is transferred into the substrate 400 using the silicon carbide ARC layer 402 as a hardmask. The pattern is transferred into the substrate 400 by etching it using an appropriate chemical etchant. Thereafter, the silicon carbide layer 402 is optionally removed from the substrate structure 450 by etching it using an appropriate chemical etchant (e. g., $CHF_3$).

Although several preferred embodiments which incorporate the teachings of the present invention have been shown and described in detail, those skilled in the art can readily devise many other varied embodiments that still incorporate these teachings.

What is claimed is:

1. A method of forming a device, comprising:

forming a doped silicon carbide layer on a substrate in a deposition chamber, wherein the doped silicon carbide layer is formed by reacting a gas mixture comprising an organosilane compound and a dopant selected from the group of ammonia ($NH_3$), methane ($CH_4$), silane ($SiH_4$), ethylene ($C_2H_4$), acetylene ($C_2H_2$), and combinations thereof, and wherein the doped silicon carbide layer has a compressibility that varies as a function of the amount of dopant in the gas mixture;

treating the doped silicon carbide layer by exposing the doped silicon carbide layer deposited on the substrate to a plasma; and defining a pattern in at least one region of the doped silicon carbide layer.

2. The method of claim 1, wherein the plasma is generated by providing one or more inert gas to a process chamber; and applying an electric field to the one or more inert gas in the process chamber.

3. The method of claim 2, wherein the one or more inert gas is selected from the group of helium (He), argon (Ar) and nitrogen ($N_2$), and combinations thereof.

4. The method of claim 1, wherein the electric field is a radio frequency (RF) power in a range of about 200 watts to about 1000 watts.

5. The method of claim 1, wherein the compressibility of the deposited doped silicon carbide layer increases as the dopant concentration in the doped silicon carbide layer increases.

6. The method of claim 1, wherein the organosilane compound having the general formula $Si_xC_yH_z$, wherein x has a range of 1 to 2, y has a range of 1 to 6, and z has a range of 4 to 18.

7. The method of claim 1, wherein the gas mixture further comprises an inert gas selected from the group of helium (He), argon (Ar), nitrogen ($N_2$), and combinations thereof.

8. The method of claim 1, wherein the ratio of the organosilane compound to the dopant in the gas mixture has a range of about 1:1 to about 1:100.

9. The method of claim 1, wherein the doped silicon carbide layer has a dielectric constant less than about 5.5, the doped silicon carbide layer is an anti-reflective coating (ARC) at wavelengths less than about 250 nm, and the doped silicon carbide layer has a leakage current less than about $10^{-8}$ A/cm$^2$ at 2 MV/cm$^2$.

10. A method of fabricating an interconnect structure, comprising:

providing a substrate having a metal layer thereon;

forming a doped silicon carbide barrier layer on the metal layer, wherein the doped silicon carbide barrier layer is formed by reacting a first gas mixture comprising a organosilane compound and a dopant selected from the group of ammonia ($NH_3$), methane ($CH_4$), silane ($SiH_4$), ethylene ($C_2H_4$), acetylene ($C_2H_2$), and combinations thereof, and wherein the doped silicon carbide barrier layer has a compressibility that varies as a function of the amount of dopant in the gas mixture;

forming a first dielectric layer on the doped silicon carbide barrier layer;

forming a doped silicon carbide hard mask on the first dielectric layer; wherein the doped silicon carbide hard mask is formed by reacting a second gas mixture comprising a organosilane compound and a dopant selected from the group of ammonia ($NH_3$), methane ($CH_4$), silane ($SiH_4$), ethylene ($C_2H_4$), acetylene ($C_2H_2$), and combinations thereof, and wherein the doped silicon carbide hardmask has a compressibility that varies as a function of the amount of dopant in the gas mixture;

patterning the doped silicon carbide hard mask to define vias therethrough;

forming a second dielectric layer on the patterned doped silicon carbide hard mask;

patterning the second dielectric layer to define interconnects therethrough, wherein the interconnects are positioned over the vias defined in the doped silicon carbide hard mask;

transferring the via pattern through the first dielectric layer using the doped silicon carbide hard mask; and filling the vias and interconnects with a conductive material.

11. The method of claim 10, wherein the first dielectric layer and the second dielectric layer each have dielectric constants less than about 3 and the doped silicon carbide barrier layer and the doped silicon carbide hard mask each have dielectric constants less than about 5.5.

12. The method of claim 10, wherein the conductive material filling the vias and the interconnects is selected from the group of copper (Cu), aluminum (Al), tungsten (W), and combinations thereof.

13. The method of claim 10, wherein the metal layer on the substrate is selected from the group of copper (Cu), aluminum (Al), tungsten (W), and combinations thereof.

14. The method of claim 10, wherein the organosilane compounds of the first and second gas mixtures have the general formula $Si_xC_yH_z$, wherein x has a range of 1 to 2, y has a range of 1 to 6, and z has a range of 4 to 18.

15. The method of claim 14, wherein the organosilane compound is selected from the group of methyl silane ($SiCH_6$), dimethylsilane ($SiC_2H_8$), trimethylsilane ($SiC_3H_{10}$), tetramethylsilane ($SiC_4H_{12}$), diethylsilane ($SiC_4H_{12}$), and combinations thereof.

16. The method of claim 10, wherein the first and second gas mixtures further comprise an inert gas.

17. The method of claim 16, wherein the inert gas is selected from the group of helium (He), argon (Ar), nitrogen ($N_2$), and combinations thereof.

18. The method of claim 10, wherein the ratio of the organosilane compound to the dopant in the gas mixture of steps (b) and (d) has a range of about 1:1 to about 1:100.

19. The method of claim 10, wherein the electric field is generated from one or more radio frequency (RF) powers in a range of about 100 watts to about 1000 watts.

20. The method of claim 10, wherein the doped silicon carbide hard mask is an anti-reflective coating (ARC) at wavelengths less than about 250 nm.

21. The method of claim 10, further comprising plasma treating the doped silicon carbide barrier layer and the doped silicon carbide hard mask.

22. The method of claim 21, wherein the plasma is generated by providing one or more inert gas to a process chamber; and applying an electric field to the one or more inert gas in the process chamber.

23. The method of claim 22, wherein the one or more inert gas is selected from the group of helium (He), argon (Ar) and nitrogen ($N_2$), and combinations thereof.

24. The method of claim 10, further comprising forming a silicon carbide cap layer on the silicon carbide hard mask prior to defining a pattern therein.

25. The method of claim 10, wherein the compressibility of the deposited doped silicon carbide layer increases as the dopant concentration in the doped silicon carbide layer increases.

26. A method of forming a device, comprising:

forming a doped silicon carbide layer on a substrate in a deposition chamber, wherein the doped silicon carbide layer is formed by reacting a gas mixture comprising an organosilane compound and a dopant selected from the group of ammonia ($NH_3$), methane ($CH_4$), silane ($SiH_4$), ethylene ($C_2H_4$), acetylene ($C_2H_2$), and combinations thereof, and wherein the doped silicon carbide layer has a compressibility that varies as a function of the amount of dopant in the gas mixture;

forming a silicon carbide cap layer on the doped silicon carbide layer; and defining a pattern in at least one region of the silicon carbide cap layer and the doped silicon carbide layer.

27. The method of claim 26, wherein the organosilane compound having the general formula $Si_xC_yH_z$, wherein x has a range of 1 to 2, y has a range of 1 to 6, and z has a range of 4 to 18.

28. The method of claim 27, wherein the organosilane compound is selected from the group of methyl silane ($SiCH_6$), dimethylsilane ($SiC_2H_8$), trimethylsilane ($SiC_3H_{10}$), tetramethylsilane ($SiC_4H_{12}$), diethylsilane ($SiC_4H_{12}$), and combinations thereof.

29. The method of claim 26, wherein the gas mixture further comprises an inert gas selected from the group of helium (He), argon (Ar), nitrogen ($N_2$), and combinations thereof.

30. The method of claim 26, wherein the ratio of the organosilane compound to the dopant in the gas mixture has a range of about 1:1 to about 1:100.

31. The method of claim 26, wherein the doped silicon carbide layer has a dielectric constant less than about 5.5, the doped silicon carbide layer is an anti-reflective coating (ARC) at wavelengths less than about 250 nm, and the doped silicon carbide layer has a leakage current less than about $10^{-8}$ A/cm$^2$ at 2 MV/cm$^2$.

32. The method of claim 26, wherein the compressibility of the deposited doped silicon carbide layer increases as the dopant concentration in the doped silicon carbide layer increases.

* * * * *

UNITED STATES PATENT AND TRADEMARK OFFICE

CERTIFICATE OF CORRECTION

PATENT NO. : 7,001,850 B2
APPLICATION NO. : 10/894872
DATED : February 21, 2006
INVENTOR(S) : Srinivas D. Nemani et al.

It is certified that error appears in the above-identified patent and that said Letters Patent is hereby corrected as shown below:

Column 5, Line 53: Change “ethyene” to --ethylene--

Column 6, Line 53: Before “an”, delete “the”

Column 9, Line 13: After “layer”, delete “is”

Column 9, Line 33: After “layer”, delete “is”

Column 9, Line 57: Change “he” to --The--

Signed and Sealed this

Nineteenth Day of September, 2006

JON W. DUDAS
*Director of the United States Patent and Trademark Office*